US010347348B2

United States Patent
Kojima

(10) Patent No.: US 10,347,348 B2
(45) Date of Patent: Jul. 9, 2019

(54) SEMICONDUCTOR MEMORY DEVICE AND DATA SETTING METHOD

(71) Applicant: Winbond Electronics Corp., Taichung (TW)

(72) Inventor: Hidemitsu Kojima, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 15/888,865

(22) Filed: Feb. 5, 2018

(65) Prior Publication Data

US 2018/0226130 A1    Aug. 9, 2018

(30) Foreign Application Priority Data

Feb. 6, 2017    (JP) ................................. 2017-019711

(51) Int. Cl.
| | |
|---|---|
| *G11C 16/32* | (2006.01) |
| *G11C 16/10* | (2006.01) |
| *G11C 16/04* | (2006.01) |
| *G11C 7/22* | (2006.01) |
| *G11C 16/08* | (2006.01) |

(52) U.S. Cl.
CPC .............. *G11C 16/32* (2013.01); *G11C 7/225* (2013.01); *G11C 16/0483* (2013.01); *G11C 16/10* (2013.01); *G11C 16/08* (2013.01)

(58) Field of Classification Search
CPC ..... G11C 16/32; G11C 16/0483; G11C 16/10; G11C 16/08; G11C 7/22; G11C 7/222; G11C 7/225
USPC .................................................... 365/185.17
See application file for complete search history.

(56) References Cited

U.S. PATENT DOCUMENTS

| | | | | |
|---|---|---|---|---|
| 2006/0044874 A1* | 3/2006 | Tokiwa | ............. | G11C 16/0483 365/185.21 |
| 2014/0089623 A1* | 3/2014 | Ha | ........................ | G11C 16/08 711/169 |

FOREIGN PATENT DOCUMENTS

| | | |
|---|---|---|
| JP | 2012-253591 | 12/2012 |
| TW | 201621326 A | 6/2016 |

OTHER PUBLICATIONS

Intellectual Property Office of the Republic of China, Office Action, dated Jan. 30, 2019, 8 pages.

* cited by examiner

*Primary Examiner* — Tha-O H Bui
*Assistant Examiner* — Alfredo Bermudez Lozada
(74) *Attorney, Agent, or Firm* — Muncy, Geissler, Olds & Lowe, P.C.

(57) ABSTRACT

The invention provides a semiconductor memory device capable of setting input data correctly, including: an input circuit outputting input data to a data bus; a logic circuit outputting the input data on the data bus to digit lines selected by a column address in response to a writing clock signal synchronized with an external clock signal; a page buffer holding data of the digit lines in holding circuits of a column selected by the column address in response to an inner clock signal generated by delaying the writing clock signal, and an address counter generating the column address in response to the writing clock signal. The column address is supplied to the logic circuit in response to the writing clock signal, and the column address is supplied to the page buffer in response to the inner clock signal which has been delayed.

8 Claims, 3 Drawing Sheets

SEMICONDUCTOR MEMORY DEVICE AND DATA SETTING METHOD

CROSS REFERENCE TO RELATED APPLICATIONS

This Application claims priority of Japan Patent Application No. 2017-019711, filed on Feb. 6, 2017, the entirety of which is incorporated by reference herein.

BACKGROUND OF THE INVENTION

Field of the Invention

The present invention relates to a semiconductor memory device such as a NAND-type flash memory, and in particular to a data setting method for setting data input in synchronization with an external clock.

Description of the Related Art

A NAND-type flash memory reads data and programs page-by-page, and the page data is stored in a page buffer. The flash memory disclosed in Patent Document 1 includes a first mode in which data stored in the page buffer is transmitted in a first bit width and a second mode in which data stored in the page buffer is transmitted in a second bit width, and a plurality of operation modes are provided.

Patent Document 1: JP2012-253591

FIG. 1 shows a configuration example of a part of a NAND-type flash memory. A page buffer 10 holds the page data read from a memory array (not shown) and holds the page data to be programmed into the memory array. A column selection circuit 30 is connected to the page buffer 10 through bidirectional digital lines DL/DLb20. During a read operation, the column selection circuit 30 outputs the selected data from the page buffer 10 to a data bus 40 in accordance with the column address. During the programming operation, the column selection circuit 30 sets the data to be programmed according to a column address to the column selected by the page buffer 10. The column address is input by an external terminal input or generated by an address counter built in the column selection circuit 30. An input/output circuit 50 is connected to an m-bit external input/output terminal 60 (m is an integer of 1 or more). During a read operation, the input/output circuit 50 outputs the data of the data bus 40 to the external input/output terminal 60. During a programming operation, the input/output circuit 50 outputs the input data from the external input/output terminal 60 to the data bus 40. Assuming that the bit width of the data bus 40 is greater than m, the input/output circuit 50 takes out the read data from the data bus 40 a plurality of times, or loads the input data into the data bus 40 a plurality of times.

The NAND-type flash memory has an ONFi type that uses an external control signal (address latch enable signal, command latch enable signal) for address or command input. The NAND-type flash memory also has a Serial Peripheral Interface (SPI) type that does not utilize this external control signal but synchronizes the serial clock signal from the outside to input data, addresses, and commands. The SPI type has a small number of terminals and can be miniaturized and reduce the cost.

FIG. 2 is a block diagram showing the details of the column selection circuit of FIG. 1. Here, in the flash memory equipped with the SPI function, the operation at the time of sequential setting the input data (to be programmed data) of the input page buffer 10 during the programming operation will be described.

A timing control circuit 80 receives a write trigger signal W_TRG, and outputs a write clock signal W_CLK to a logic circuit 86 in response to the write trigger signal W_TRG. A delay circuit 82 receives the write clock signal W_CLK output from the timing control circuit 80 and generates an internal clock signal I_CLK delayed by a predetermined time Td. A column decoder (YDEC) 88 responds to the internal clock signal I_CLK, receives a column address CA generated by an address counter 84, and outputs a column selection signal YS obtained by decoding the column address CA to the page buffer 10. The address counter 84 increases the column address CA in response to, for example, the falling edge of the internal clock signal I_CLK. The updated column address CA is output to the column decoder 88 and the logic circuit 86. The logic circuit 86 selects the digit lines DL/DLb20 according to the column address CA generated by the address counter 84 and writes the data of the data bus 40 into the selected digit lines DL/DLb20 in response to the write clock signal W_CLK.

Next, the operation of the timing chart of FIG. 3 will be described. The write trigger signal W_TRG is a signal synchronized with a clock signal CLK supplied from the outside. When receiving the write trigger signal W_TRG at a time point t1, the timing control circuit 80 outputs the write clock signal W_CLK to the timing logic circuit 86 at almost the same time. The logic circuit 86 selects the digit lines DL/DLb20 based on the column address CA generated by the address counter 86 and outputs the data of the data bus 40 to the selected digit lines DL/DLb20 in response to, for example, a rising edge of the write clock signal W_CLK. Although not shown here, the logic circuit 86 includes a write amplifier, and the write amplifier outputs the differential data to the digit lines DL/DLb20.

The plurality of digit lines DL/DLb20 are each connected to latch circuits of corresponding columns of the page buffer 10 through a plurality of column select transistors. For example, when the page buffer is a 2K byte, if the number of digit lines DL/DLb20 is 16, a pair of the digit lines DL/DLb20 is connected to latch circuits of 128 columns. If the number of digit lines DL/DLb20 is 32, a pair of digital lines DL/DLb20 is connected to latch circuits of 64 columns. The plurality of column select transistors are selectively opened and closed by the column select signal YS. When the column select transistor is turned on, the corresponding latch circuits of the page buffer 10 are electrically connected to the digit lines DL/DLb20. Since the physical wiring of the digit lines DL/DLb20 are connected to the plurality of latch circuits as described above, the wiring capacitance and wiring impedance of the digit lines DL/DLb20 are relatively large, and thus it takes a certain amount of time for the driving of the digit lines DL/DLb20 to reach a sufficient level by the write amplification.

The delay circuit 82 sets the delay time Td that is longer than the time required for the write amplifier to drive the digit lines DL/DLb20. As a result, at a time point t2, a column select signal YS which is delayed by a time Td from the write clock signal W_CLK is generated. At the time point t2 when the potential difference of the digit lines DL/DLb20 reaches a sufficient level, the column select transistor is turned on and the differential data is set to the latch circuits of the corresponding columns of the page buffer 10.

Next, at a time point t3, the address counter 84 automatically increases and updates the row address at the falling edge of the internal clock signal I_CLK. Time point t3 indicates the time point at which the data of the digit lines DL/DLb20 is written to the latch circuits of the page buffer 10. The column address updated by the address counter 84 is output to the logic circuit 86 and the column decoder 88, the following input data is set to the page buffer 10, and eventually the data of one page to be programmed is set to the page buffer 10. The programming operation to a selected page is performed.

In the NAND-type flash memory, if the operating frequency of the external clock signal CLK is increased, the next write clock signal may be generated before the increment of the column address, and the wrong data may be set to the latch circuits corresponding to the column address before updating.

FIG. 4 illustrates the problem of the operating frequency of the external clock signal CLK being high. At time point t1, in response to the rising edge of the write clock signal W_CLK, the logic circuit 86 starts writing differential data to the selected digit line DL/DLb20 in accordance with the column address. The writing of the digit line DL/DLb20 requires a certain write time Tw as described above. After a delay time Td that is greater than this write time Tw, the internal clock signal I_CLK is supplied to the address counter 86 and the row decoder 88. At time point t2, in response to, for example, the rising edge of the column selection signal YS, the column select transistor is turned on and the data of the digit lines DL/DLb20 is set to the latch circuits of the corresponding columns of the page buffer 10. At time point t3, the address counter 84 performs increment in response to the falling edge of the column selection signal YS or the internal clock signal I_CLK. However, when the operating frequency of the clock signal CLK becomes high, the frequency of the write trigger signal W_TRG synchronized with the clock signal CLK also increases, and the write clock signal W_CLK is generated at a substantially same time. In this way, as shown in FIG. 4, before the next column address CA is updated, the next write clock signal W_CLK is generated at time point t3', which violates the timing. As a result, the logic circuit 86 selects the digit lines DL/DLb20 according to the column address before updating and the page buffer 10 selects the column select transistors according to the updated column address. The selected digit lines DL/DLb20 do not match the selected column select transistors, and the input data cannot be correctly set to the paging buffer 10.

On the other hand, although the write time Tw of the digit lines DL/DLb20 is also considered to be shortened, this write time Tw is mainly affected by the RC constant of the digit line DL/DLb20. If it is shortened, it is impossible to avoid the circuit size and area increase.

In order to solve the conventional problems described above, the present invention aims to provide a semiconductor memory device and a method of setting input data capable of correctly setting input data.

BRIEF SUMMARY OF THE INVENTION

A detailed description is given in the following embodiments with reference to the accompanying drawings.

The present invention provides a semiconductor memory device, including: an input circuit receiving input data and outputting the input data to a data bus having width of a plurality of bits; a plurality of digit lines; a logic circuit responding to a first internal clock signal and outputting the input data on the data bus to the digit lines selected by a column address; a means of data-holding responding to a second internal clock signal generated by delaying the first internal clock signal and holding the data of the digit lines in holding circuits of the column selected by a column address; a memory cell array capable of programming the input data held in the means of data-holding; and an means of address-generation generating the column address in response to the first internal clock signal, wherein the column address is supplied to the logic circuit in response to the first internal clock signal, and the column address is supplied to the means of data-holding in response to the second internal clock signal.

The present invention also provides a data setting method for setting input data input from an external terminal in a semiconductor memory device, including: a step of loading the input data into a data bus with a width of a plurality of bits; a step of outputting the input data on the data bus to digit lines selected by a column address in response to a first internal clock signal; and a step of holding the data of the digit lines in holding circuits of the column selected by a column address in response to a second internal clock signal generated by delaying the first internal clock signal, wherein the output step uses the column address supplied in response to the first internal clock signal, and the holding step uses the column address supplied in response to the second internal clock signal.

According to the present invention, the column address is supplied to the logic circuit in response to the first internal clock signal, and the column address is supplied to the means of data-holding in response to the second internal clock signal. Therefore, even if the operating frequency of the external clock signal is increased in speed, the input data can be set to the means of data-holding without violating the timing.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Hereinafter, embodiments of the present invention will be described in detail with reference to the drawings. The semiconductor memory device of the present invention is capable of inputting data in response to an external clock signal. In a preferred aspect, the semiconductor memory device is a NAND-type flash memory with a serial interface. The serial interface is, for example, a terminal for inputting a serial clock SCLK, a terminal for inputting and outputting data, an instruction, an address, etc., a terminal for selecting a chip, and the like. In other preferred embodiments, the semiconductor memory device can be ONFi-type NAND flash memory.

Figure 1:
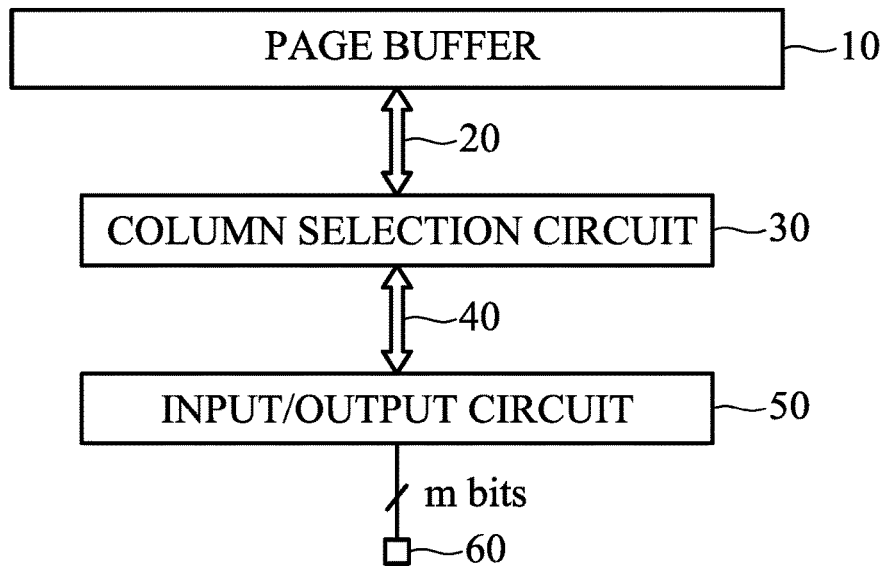
FIG. 1 is a diagram illustrating a method of reading data and a method of inputting data to be programmed for a conventional flash memory.
Figure 2:
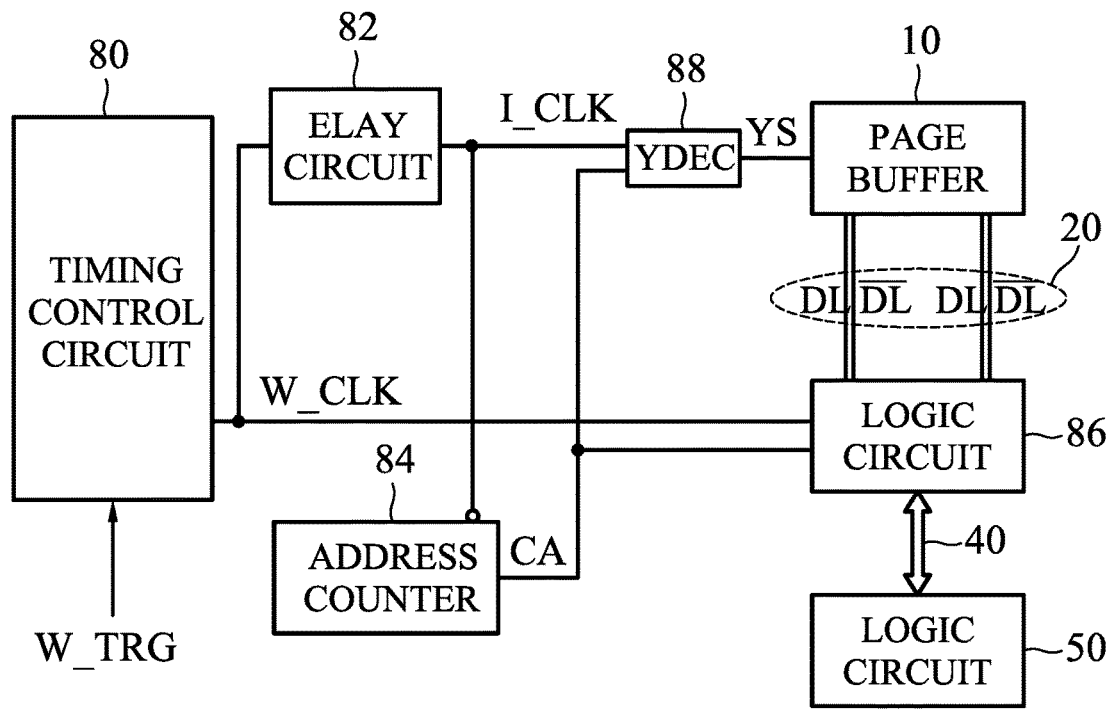
FIG. 2 shows the details of the column selection circuit of FIG. 1.
Figure 3:
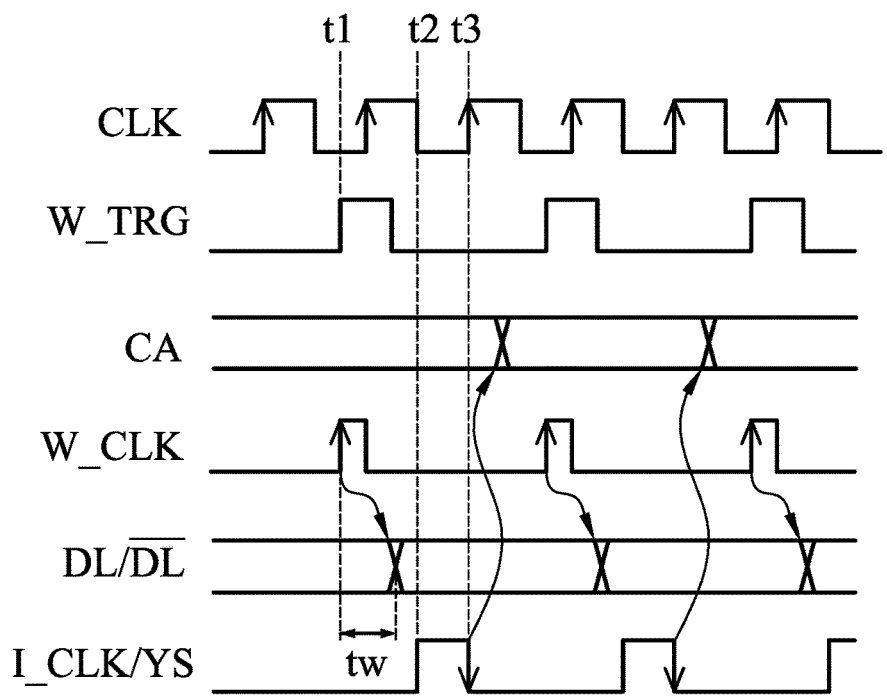
FIG. 3 is a timing chart of a serial write operation to a data page buffer in a conventional flash memory.
Figure 4:
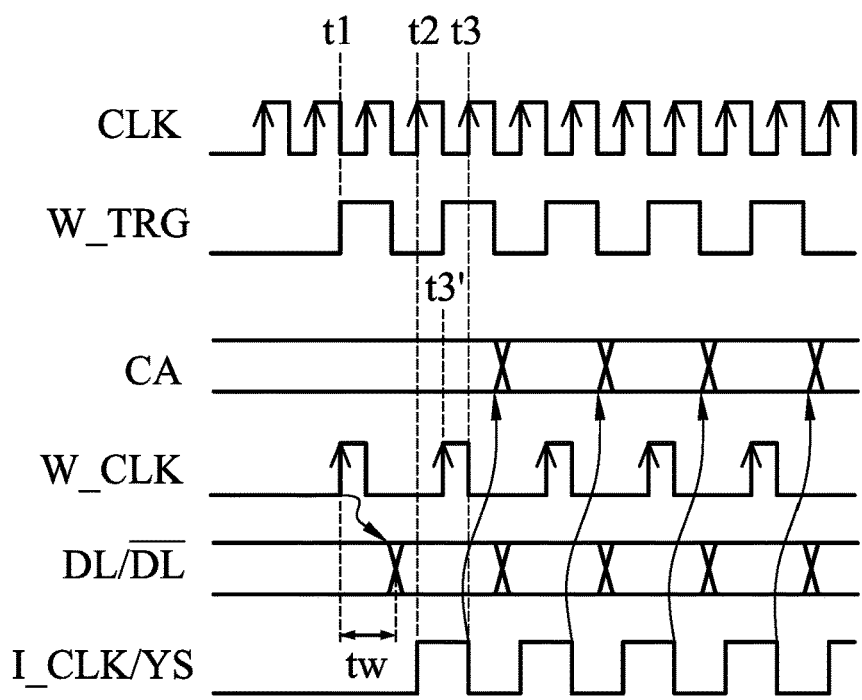
FIG. 4 is a timing chart illustrating a problem in serial writing operation to a page buffer in the conventional flash memory.
Figure 5:
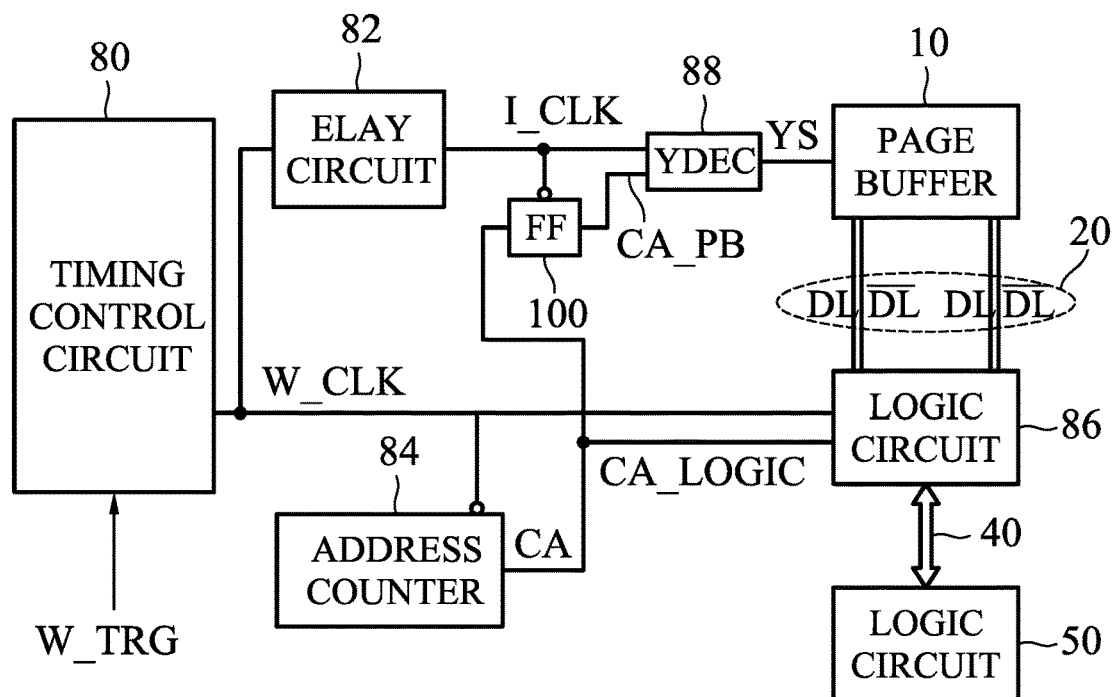
FIG. 5 is a diagram showing the main parts of a flash memory according to an embodiment of the present invention.

FIG. 5 is a diagram showing the main parts of a flash memory according to an embodiment of the present invention. Elements in the drawings that are the same as in FIG. 2 are assigned the same reference characters. In the flash memory of this embodiment, the address counter 84 will automatically increase in response to the write clock signal W_CLK and output the column address updated by this increment. At this time, the address counter 84 may also be responsive to either the rising edge or the falling edge of the write clock signal W_CLK. The column address CA generated by the address counter 84 is supplied to the logic circuit 86 and a flip-flop 100.

The flip-flop 100 responds to the internal clock signal I_CLK delayed by the write clock signal W_CLK, holds the column address CA output from the address counter 84, and supplies the held column address CA to the column decoder 88. At this point, the flip-flop 100 may also respond to either the rising edge or the falling edge of the internal clock signal I_CLK. The column decoder 88 decodes the column address held by the flip-flop 100 and outputs the column selection signal YS to the page buffer 10. The page buffer 10 electrically connects the latch circuits of the selected columns to the digit line DL/DLb20 through the column select transistor that is turned on by the column selection signal YS.

In response to a clock signal supplied from the outside, the input/output circuit 50 performs serial/parallel conversion on the data supplied to the external terminals and outputs the converted data to the data bus 40 having width of a plurality of bits. In response to the write clock signal W_CLK, the logic circuit 86 selects the digit lines DL/DLb20 according to the column address CA generated by the address counter 84 and outputs the data of the data bus 40 to the selected digit lines DL/DLb20. In a preferred aspect, the logic circuit 86 includes a write amplifier for driving the digit lines DL/DLb20 having width of a plurality of bits. The logic circuit 86 selects a write amplifier in accordance with the column address CA and writes the differential data to the digit lines DL/DLb20 connected to the selected write amplifier. Writing differential data to the digit line DL/DLb20 may take a certain amount of time. Therefore, it is preferred that the write amplifier drive the digit lines DL/DLb20 in response to the rising edge of the write clock signal W_CLK. However, the bit lines DL/DLb 20 may also be driven in response to the falling edge of the write clock signal W_CLK.

Figure 6:
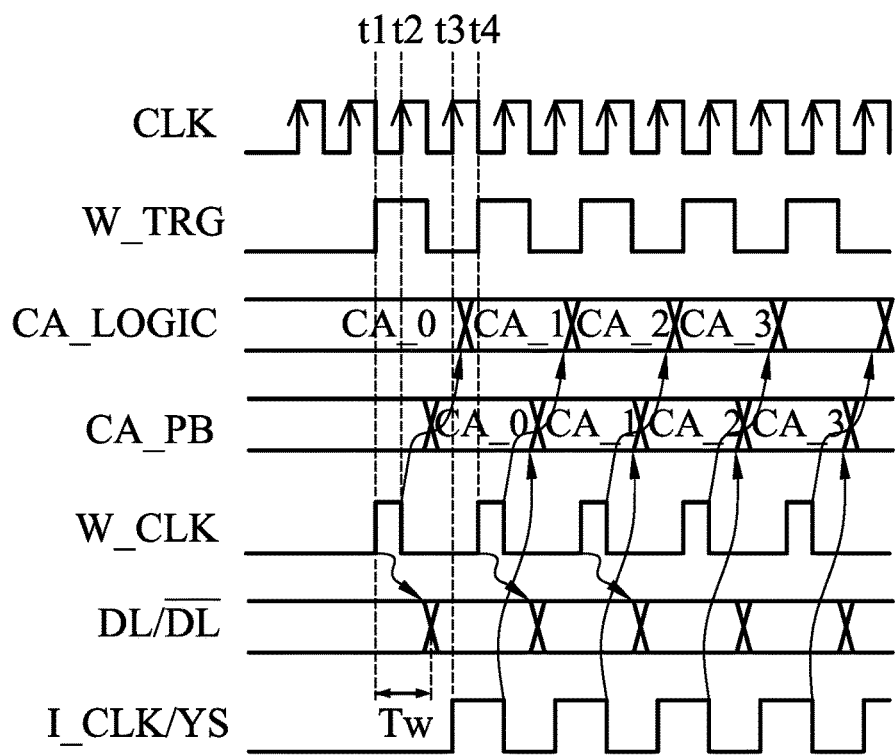
FIG. 6 is a timing chart of a serial write operation to a data page buffer according to an embodiment of the present invention.

Next, a method of sequentially setting the input data to the page buffer 10 in response to the external clock signal will be described with reference to the timing chart of FIG. 6. The external terminal of the flash memory is supplied with the serial clock signal CLK. The timing control circuit 80 receives the write trigger signal W_TRG synchronized with the clock signal CLK at time point t1, and outputs the write clock signal W_CLK at almost the same time. The write clock signal W_CLK is supplied to the address counter 84, the logic circuit 86, and the delay circuit 82.

The logic circuit 86 writes the differential data to the digit lines DL/DLb20 in response to the rising edge of the write clock signal W_CLK. At this time, the column address CA_0 of the address counter 84 is input to the logic circuit 86 through the column address logic section CA_LOGIC, and the logic circuit 86 selects the digital lines DL/DLb20 from the plurality of digit lines DL/DLb20 according to the column address CA_0. DLb20.

Next, at time point t2, the address counter 84 increases the address in response to the falling edge of the write clock signal W_CLK and outputs the updated column address CA_1. However, the increment of the address counter 84 is not necessarily performed at time point t2, but also at time point t1.

At time point t3 after the elapse of the time Tw written to the digit line DL/DLb20 by the logic circuit 86, the internal clock signal I_CLK is output from the delay circuit 82. In addition, since the delay time of the column decoder 88 is very short, the internal clock I_CLK and the column selection signal YS are expressed at the same time. The flip-flop 100 outputs the held column address CA_0 to the column decoder 88 through the column address PB section CA_PB in response to the internal clock signal I_CLK. Here, it must be noted that the flip-flop 100 will maintain the column address CA_1 at the next internal clock signal I_CLK. The page buffer 10 responds to, for example, a rising edge of the column selection signal YS, and sets the data of the digit lines DL/DLb20 to the latch circuits of the selected columns.

At time point t4, the next write clock signal W_CLK is generated, but the address counter 84 synchronized with it is increased. The updated column address CA_2 is input to the logic circuit 86 through the column address logic section CA_LOGIC, and the logic circuit 86 selects the corresponding digit lines DL/DLb20 according to the column address CA_2. At this time, since the flip-flop 100 holds the column address CA_1 before updating, it matches the column address of the digit lines DL/DLb20 selected by the logic circuit 86.

In this way, according to this embodiment, the column address logic section CA_LOGIC for the logic circuit 86 is separated from the column address PB section CA_PB for the page buffer 10. Therefore, even if the operation frequency of the external clock signal becomes high, the column address of the logic circuit 86 can be matched with the column address of the page buffer 10, and it is possible to solve the conventional timing violation of the column address.

According to the above embodiment, an example is shown in which data is input in synchronization with an external clock signal having a high operating frequency. However, the present invention is not limited to this. The present invention can be applied to a NAND-type flash memory such as ONFi. In this case, the present invention can also be applied to the case where the clock signal CLK is not a signal supplied from the outside but an internal clock signal, and data is set to a page buffer in synchronization with the internal clock signal.

In the above embodiment, the logic circuit 86 drives the digit lines 20 by a write amplifier (write driver). However, the digit lines 20 may be driven by a drive circuit other than this.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor memory device, comprising
an input circuit receiving input data and outputting the input data to a data bus having a width of a plurality of bits;
a plurality of digit lines;
a logic circuit responding to a first internal clock signal and outputting the input data on the data bus to the digit lines selected by a column address;
a data-holding circuit responding to a second internal clock signal generated by delaying the first internal clock signal and holding the data of the digit lines of a column selected by the column address;
a delay circuit delaying the first internal clock signal and outputs the second internal clock signal;
a memory cell array capable of programming the input data held in the data-holding circuit; and
an address-generation circuit generating the column address in response to the first internal clock signal,
wherein the column address is supplied to the logic circuit in response to the first internal clock signal,
the column address is supplied to the data-holding circuit in response to the second internal clock signal, and
a delay time of the delay circuit is longer than a time it takes for the logic circuit to output data to the digit lines.

2. The semiconductor memory device as claimed in claim 1, wherein the data-holding circuit further comprises:
a decoding circuit decoding the column address to generate a column selection signal,
wherein column select transistors are driven by the column selection signal so that the digit lines are electrically connected to the data-holding circuit.

3. The semiconductor memory device as claimed in claim 2, wherein the decoding circuit comprises:
a flip-flop responding to the second internal clock signal and holding the column address generated by the address-generation circuit.

4. The semiconductor memory device as claimed in claim 1, wherein the logic circuit comprises:
a write amplifier for outputting differential data to the digit lines.

5. The semiconductor memory device as claimed in claim 1, wherein the semiconductor memory device is a NAND-type flash memory equipped with a serial interface function, and the first internal clock signal is generated in response to an external clock signal.

6. A data setting method for setting input data input from an external terminal in a semiconductor memory device, comprising:
a step of loading the input data into a data bus with a width of a plurality of bits;
a step of outputting the input data on the data bus to digit lines selected by a column address in response to a first internal clock signal; and
a step of holding the data of the digit lines in holding circuits of a column selected by the column address in response to a second internal clock signal generated by delaying the first internal clock signal,
wherein the output step uses the column address supplied in response to the first internal clock signal, and the holding step uses the column address supplied in response to the second internal clock signal, and
a delay time of the second internal clock signal is longer than a time required for outputting data to the digit lines in the output step.

7. The data setting method as claimed in claim 6, wherein the loading step loads the input data in response to an external clock signal, and the first internal clock signal is generated in response to the external clock signal.

8. The data setting method as claimed in claim 6, further comprising:
a step of programming the input data which is set to a selected page of a memory array cell.

* * * * *